United States Patent
Bisello et al.

(10) Patent No.: US 8,513,552 B2
(45) Date of Patent: Aug. 20, 2013

(54) ELECTRICAL SWITCH CONNECTOR ASSEMBLY AND METHOD OF CONNECTING AN ELECTRICAL DEVICE TO AN ELECTRICAL SWITCH ASSEMBLY

(75) Inventors: Fiorenzo Bisello, Mestrino (IT); Yvon Jean Pierre Fichen, Paris (FR); Luc Marc Alphonse Hernoux, Vouille (FR); Roberto Sandano, Conselve (IT); Paolo Zangirolami, Padua (IT)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 13/486,046

(22) Filed: Jun. 1, 2012

(65) Prior Publication Data

US 2013/0168211 A1 Jul. 4, 2013

Related U.S. Application Data

(63) Continuation of application No. 12/526,907, filed as application No. PCT/US2007/061966 on Feb. 12, 2007, now abandoned.

(51) Int. Cl.
*H01H 1/58* (2006.01)
(52) U.S. Cl.
USPC ....................................... 200/51 R

(58) Field of Classification Search
USPC .......... 200/51 R, 43.11, 43.14, 51.02, 43.01, 200/50.01, 318, 329
See application file for complete search history.

(56) References Cited

U.S. PATENT DOCUMENTS

| 6,770,829 B1 * | 8/2004 | Hart ............................. 200/314 |
| 7,342,194 B2 * | 3/2008 | Karweik et al. .............. 200/329 |
| 7,348,510 B1 * | 3/2008 | Foley et al. ................... 200/293 |

* cited by examiner

*Primary Examiner* — Edwin A. Leon
(74) *Attorney, Agent, or Firm* — Timothy M. Morella

(57) ABSTRACT

An electrical connector assembly includes a connector, designed to connect to a mating electrical device while maintaining a closed circuit throughout. The electrical device includes conductive contacts. The electrical connector includes an insulating housing with at least a pair of input/output terminals mounted thereon. The terminals include contacts for engaging the electrical device. A switch mechanism, mounted on the housing for movement between connecting and disconnecting positions, includes a latch member and at least one switch terminal. In the connecting position, the latch member engages a latch on the electrical device with the switch terminal out of engagement with the input/output terminals. In the disconnecting position, the latch member disengages from the latch on the electrical device for removal from the assembly with the switch terminal in engagement with the input/output terminals to maintain a closed circuit throughout when the electrical device is removed.

14 Claims, 6 Drawing Sheets

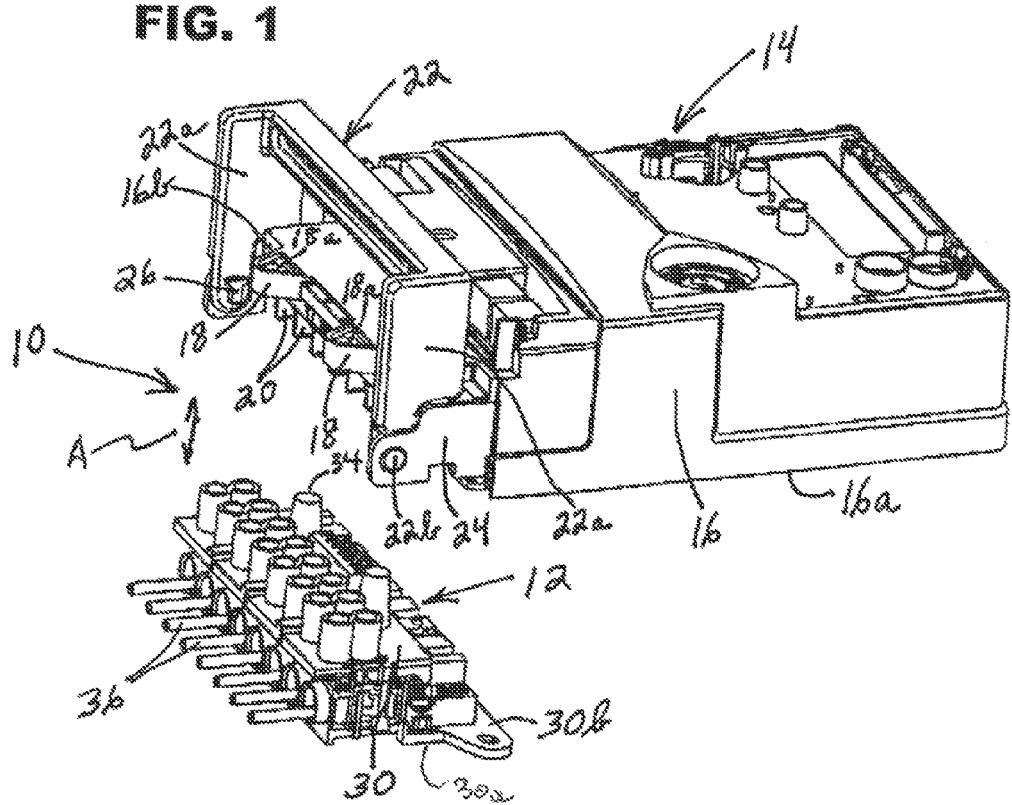
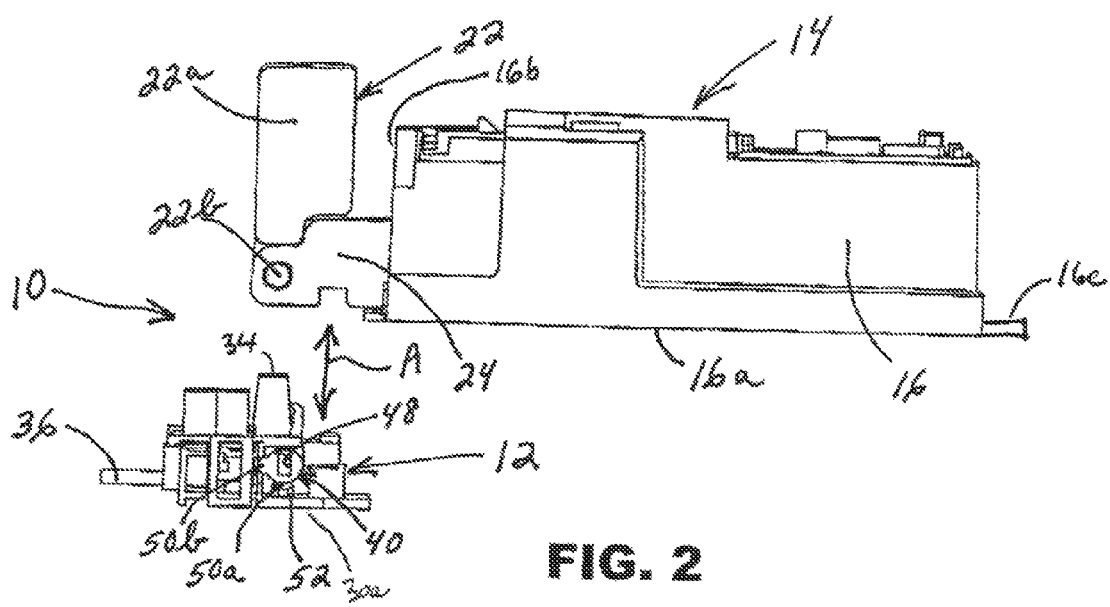

ELECTRICAL SWITCH CONNECTOR ASSEMBLY AND METHOD OF CONNECTING AN ELECTRICAL DEVICE TO AN ELECTRICAL SWITCH ASSEMBLY

REFERENCE TO RELATED APPLICATIONS

The Present Disclosure claims priority to prior-filed U.S. Non-Provisional patent application Ser. No. 12/526,907, entitled "Electrical Switch Connector Assembly And Method Of Connecting An Electrical Device To An Electrical Switch Assembly," filed on 12 Aug. 2009 with the United States Patent And Trademark Office (USPTO). The '907 Application is a United States National Phase filing of PCT Patent Application No. PCT/US2010/0061966, entitled "Electrical Switch Connector Assembly And Method Of Connecting An Electrical Device To An Electrical Switch Assembly," filed on 12 Feb. 2007 with the USPTO as Receiving Office of the Patent Cooperation Treaty. The content of each of the aforementioned Patent Applications is incorporated in their entireties herein.

BACKGROUND OF THE PRESENT DISCLOSURE

This Present Disclosure generally relates to the art of electrical connectors and, particularly, to an electrical switch connector assembly incorporating a switch to electrically and mechanically connect and disconnect a mating electrical device while maintaining a closed electrical circuit continuously through the connector assembly.

Electrical power is supplied to an individual site by external electrical power line conductors located above or below ground. In a conventional arrangement, electrical power line conductors and electrical load conductors are connected directly to contacts in a watt-hour meter mounted on a building wall. The watt-hour meter is used to measure the electric power drawn through the circuit.

These meters must be removed periodically for servicing, calibration or replacement. Since the meter is connected to the circuit in series, the removal of the meter will open the circuit. In order to avoid such an open circuit condition after the meter is removed, the input and output electrical conductors to and from the meter must be shorted.

A number of methods exist to create this short circuit. Two such methods require the skill of an electrical technician. In one instance, the technician is required to place jumper wires between the input and output conductors. In another instance, the technician uses a separate device that connects to all of the input and output conductors at the same time.

Still another method includes the use of a non-conductive blade inserted between input and output and shorting terminals. When the blade is inserted, the shorting arms are moved out of engagement with the input and output terminals allowing current to flow through the meter. When the blade is removed from between the terminals, the shorting terminals engage respective input and output terminals creating the short that will allow the meter to be removed without opening the circuit. This method works well but there is no provision for wiping the terminals to remove any non-conductive material on the contact surfaces. Also to allow for relatively easy insertion and removal of the non-conductive blade, the spring force in the shorting terminals cannot be too great. If there is any non-conductive material build-up on the contact surfaces, the spring force may not be great enough to force the shorting terminal through the build up resulting in an incomplete or even non-existent electrical connection. Also with a blade there is an extra part that can be lost and there still must be a separate feature that locks the meter with the connector.

A final method includes a projection on the meter that acts like the blade method described above. Although the projection is part of the meter and does not require a separate part that can get lost, there still must be a separate feature that locks the meter with the connector.

These prior art methods are expensive since in some cases an expensive technician must be employed or in other instances the meter is more complicated requiring extra parts. Also a consistent electrical contact is not always ensured since the contacting surfaces of the mating switch terminals don't provide any wiping that can remove any non-conductive build up on the mating surfaces of the terminals. Also some of these methods allow the terminals to be exposed to the weather and are also capable of accidental or unintentional contact by testing personnel or other personnel unaware of the exposed electrical potential.

SUMMARY OF THE PRESENT DISCLOSURE

The Present Disclosure is directed to solving the problems of the prior art by providing an electrical connector assembly that uses a connector with a switch, the connector being readily connected and disconnected both electrically and mechanically to a mating electrical device, such as an electrical meter, while maintaining a continuous closed circuit current flow through the connector. Also, the connector provides a wiping action to improve the electrical connection and will be safer with fewer exposed terminals.

In an exemplary embodiment of the Present Disclosure, an electrical connector assembly incorporates a connector with a switch mechanism and is designed to electrically and mechanically connect and disconnect a mating electrical device while maintaining a closed circuit current flow through the connector. The mating electrical device includes a plurality of conductive contacts. The electrical connector includes an insulating housing with at least a pair of input and output terminals from one circuit mounted on the housing. The terminals include contact portions for engaging the contacts of the mating electrical device.

The switch mechanism is movably mounted on the housing for movement between a connecting position and a disconnecting position. The switch mechanism includes a latch member and at least one switch terminal. In the connecting position, the latch member is inter-engaged with a latch on the mating electrical device with the switch terminal out of engagement with the input and output terminal. In the disconnecting position, the latch member is disengageable from the latch on the mating electrical device so that the device can be removed from the assembly with the switch terminal in engagement with the input and output terminals to maintain a circuit through the connector when the mating electrical device is removed.

According to one aspect of the Present Disclosure, the switch mechanism comprises a rotating shaft mounted on the housing. The switch terminal is disposed at an outer periphery of the shaft. The shaft is elongated and is rotatable about its longitudinal axis. The input and output terminals are spaced longitudinally along the shaft. The switch terminal extends longitudinally for shorting the input and output terminals in the disconnecting position of the shaft.

According to another aspect of the Present Disclosure, the mating electrical device includes an actuator for moving the switch mechanism between its connecting and disconnecting positions. The actuator includes the latch for inter-engagement with the latch member on the movable switch mechanism. In the exemplary embodiment, the actuator comprises a lever pivotally mounted on the mating electrical device on an axis coincident with the axis of rotation of the shaft that forms the switch mechanism.

According to a further aspect of the Present Disclosure, the connector housing and the mating electrical device have mounting faces mountable on a support structure in a coplanar relationship. The mating electrical device is mated onto the housing in a mating direction generally perpendicular to their mounting faces. A plurality of guide projections on the connector housing extend in the mating direction for positioning in a corresponding plurality of guide apertures in the mating electrical device.

BRIEF DESCRIPTION OF THE FIGURES

The organization and manner of the structure and operation of the Present Disclosure, together with further objects and advantages thereof, may best be understood by reference to the following Detailed Description, taken in connection with the accompanying Figures, wherein like reference numerals identify like elements, and in which:

FIG. 1 is a perspective view of an electrical connector assembly including a connector and a mating electrical device, with the connector and the device in a disconnecting position;

FIG. 2 is a side elevation view of the assembly of FIG. 1;

FIG. 7 is a perspective view of the switch shaft, with one of the switch terminals removed from the shaft;

DESCRIPTION OF THE PREFERRED EMBODIMENTS

Figure 3:
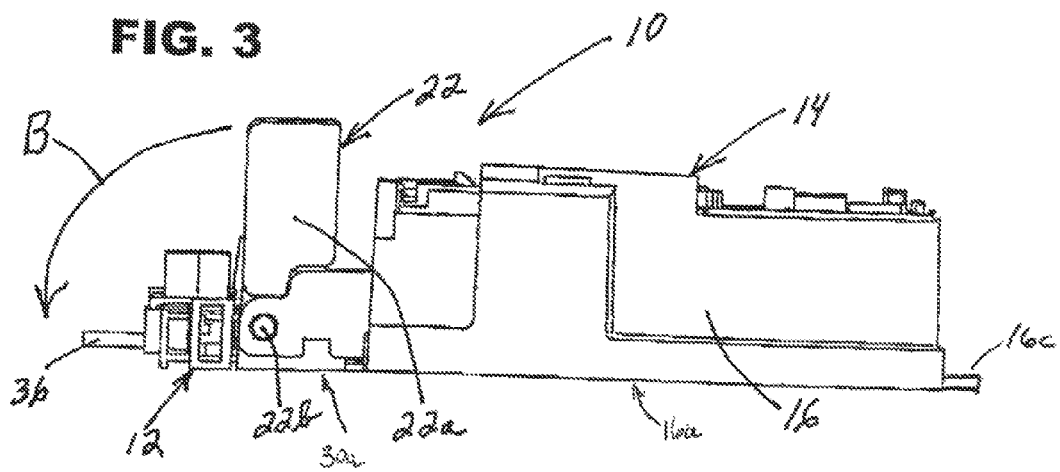
FIG. 3 is a view similar to that of FIG. 2, but with the device connected to the connector and with the actuating lever on the device in its disconnecting position.

While the Present Disclosure may be susceptible to embodiment in different forms, there is shown in the Figures, and will be described herein in detail, specific embodiments, with the understanding that the disclosure is to be considered an exemplification of the principles of the Present Disclosure, and is not intended to limit the Present Disclosure to that as illustrated.

As such, references to a feature or aspect are intended to describe a feature or aspect of an example of the Present Disclosure, not to imply that every embodiment thereof must have the described feature or aspect. Furthermore, it should be noted that the description illustrates a number of features. While certain features have been combined together to illustrate potential system designs, those features may also be used in other combinations not expressly disclosed. Thus, the depicted combinations are not intended to be limiting, unless otherwise noted.

In the embodiments illustrated in the Figures, representations of directions such as up, down, left, right, front and rear, used for explaining the structure and movement of the various elements of the Present Disclosure, are not absolute, but relative. These representations are appropriate when the elements are in the position shown in the Figures. If the description of the position of the elements changes, however, these representations are to be changed accordingly.

Referring to the drawings in greater detail, and first to FIGS. 1 and 2, the Present Disclosure is incorporated in an electrical connector assembly, generally designated 10, which includes an electrical connector, generally designated 12, and a mating electrical device, generally designated 14. Although the Present Disclosure has a variety of applications, the mating electrical device 14 is an electrical meter in the exemplary embodiment. An electrical current is supplied from a source into and out of the meter 14 through the connector 12 and through a current transformer. If the transformer secondary circuit is open while a load is connected to the transformer primary circuit, very high voltage spikes (kilovolts) induced over the open secondary circuit are likely to impair human safety and/or transformer isolation. To prevent this risk it is essential that a continuous closed electrical circuit be maintained even when the meter is removed.

The meter, according to the Present Disclosure, can be very easily and safely mated and unmated with the connector in the direction of double-headed arrow "A." As will be seen hereinafter, when the meter is mated with the connector, an electrical circuit flows through the connector into and out of the meter. When the meter is unmated from the connector, the current continues to flow through the connector with the help from a shorting circuit created by a shorting terminal. The connector housing 30 and the mating electrical device 14 have mounting faces 30a, 16a that are mountable on a support structure in a coplanar relationship. The mating electrical device is mateable onto the housing in a direction generally perpendicular to their mounting faces.

Still referring to FIGS. 1 and 2, the electrical device 14 includes a non-conductive housing 16 having a generally planar rear mounting face 16a and a bottom face 16b. A pair of guide bosses 18 project from the bottom face 16b. The guide bosses 18 have through-holes 18a that extend in the mating direction "A." As best seen in FIG. 1, a row of blade contacts 20 made from a conductive material are exposed across the bottom of the housing 16. An actuator in the form of an actuating lever, generally designated 22, is pivotally mounted at the bottom of the housing 16. The lever has a pair of pivot arms 22a that is pivotally mounted by means of a pair of pivot bosses 22b inside a pair of pivot flanges 24 that project forwardly of the housing 16 at opposite ends of the row of blade contacts 20. A somewhat elongated latch projection or boss 26 projects inwardly at the distal end of each pivot arm 22a. Pivot bosses 22b project outwardly at the distal end of each pivot arm 22a. A pair of locks or latch projections 26 is located generally on the pivot axis. The pivot axis of the actuator lever 22, as defined by the pivot bosses 22b, is coincidental with the axis 42 of rotation of the switch shaft 40 described below.

Figure 4:
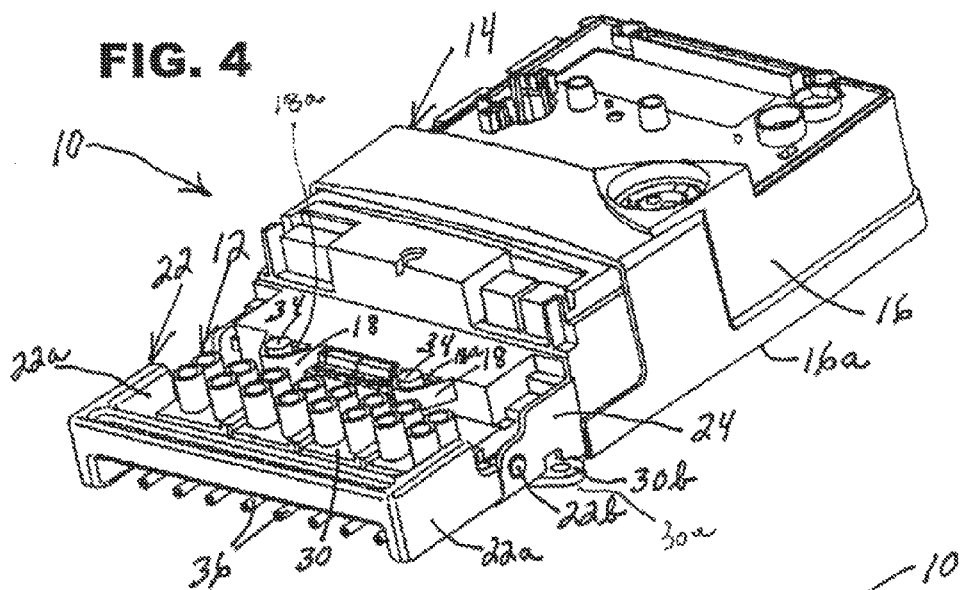
FIG. 4 is a perspective view of the assembly with the actuating lever on the device pivoted to its connecting position.

FIG. 3 shows the electrical device 14 moved into full mating condition with the connector 12. Once the device is mated with the connector, the actuating lever 22 on the meter can be pivoted in the direction of arrow "B" until the lever reaches a connecting position as shown in FIGS. 4 and 5.

Figure 5:
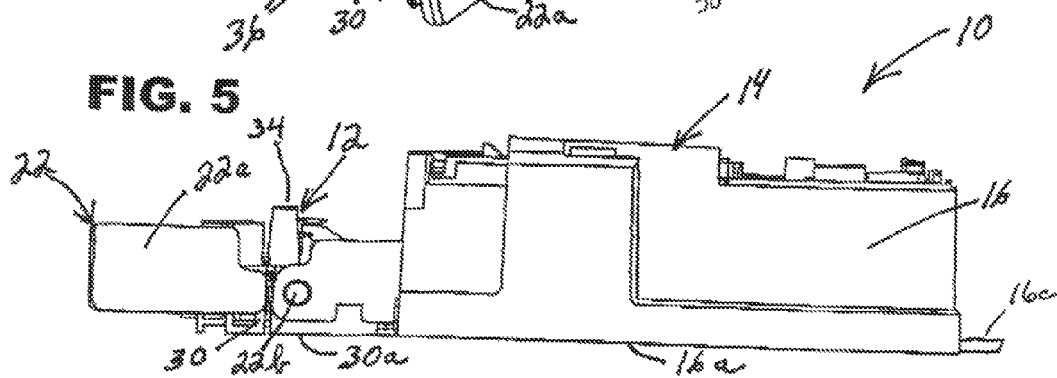
FIG. 5 is a view similar to that of FIG. 3, with the actuating lever on the device pivoted to its connecting position.
Figure 6:
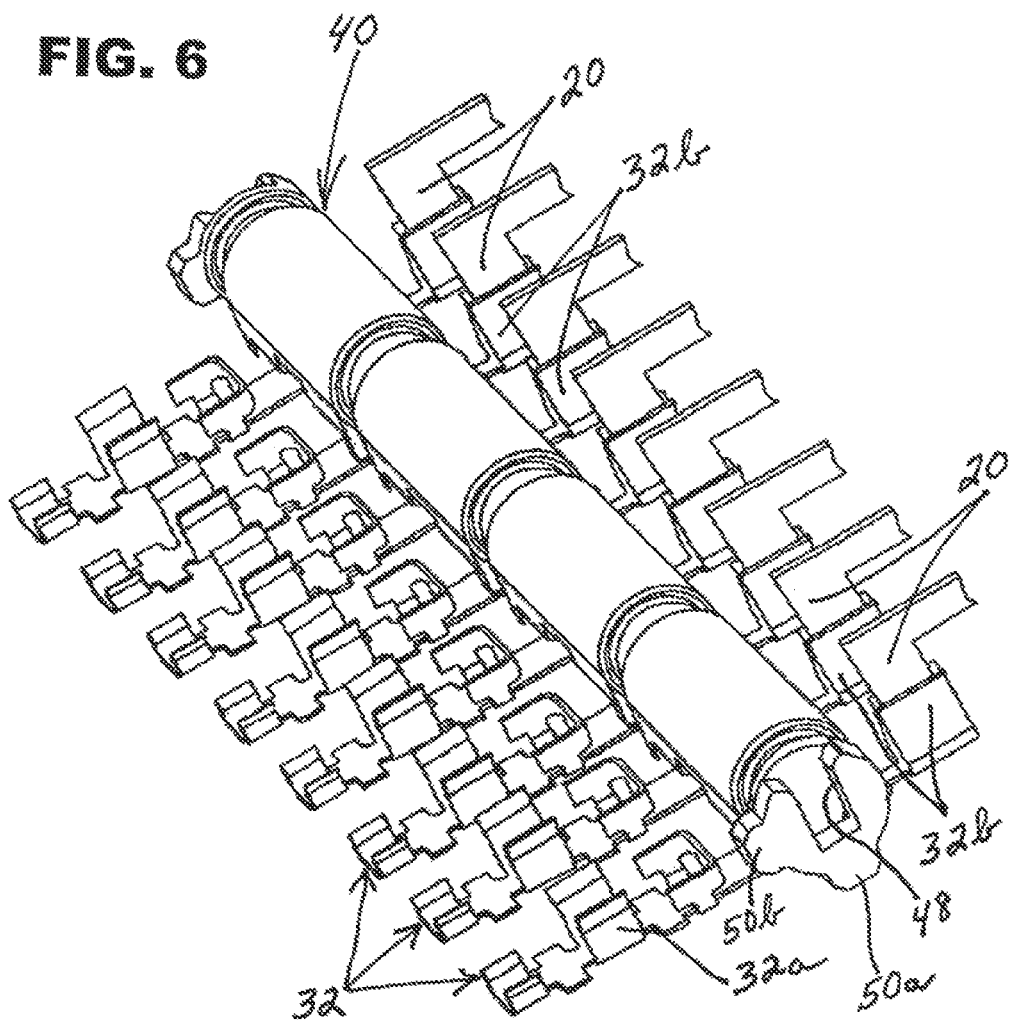
FIG. 6 is a fragmented, partially cut-away perspective view of the assembly, with the connector housing removed to show the switch shaft, and with the housing of the electrical device removed to show the interconnection of the contacts and the terminals of the assembly in the disconnecting position.

Referring to FIG. 6 in conjunction with FIGS. 1 and 5, the connector 12 includes a non-conductive housing 30 (FIGS. 1 and 5) that mounts a plurality of input and output terminals 32 (FIG. 6). The housing 30 has a pair of guide projections 34 as best seen in FIGS. 1 and 5. The guide projections 34 are received within the guide holes 18a (FIG. 1) of the guide bosses 18 at the bottom of the housing 16 of the meter 14 as can be seen clearly in FIG. 4. The terminals 32 are elongated and include terminating portions 32a (FIG. 6) at one end for termination to a plurality of electrical wires 36. The terminals have contact portions 32b at the opposite ends thereof for receiving the blade contacts 20 from the device 14. The contact portions 32b are spring-loaded and are bifurcated for receiving the blade contacts and clamping the blade contacts under good contacting forces.

It should be understood that electrical device 14 can take a variety of configurations or characteristics. In the exemplary embodiment, for instance, the electrical device 14 is a three-phase meter requiring four inputs and four outputs. One pair of input and output terminals is used for each phase with the remaining pair used for a neutral circuit. In other words, it can be seen that there are eight electrical wires 36 leading to eight terminals 32 in the connector 12, with the eight terminals being engageable with eight blade contacts 20 of the meter 14.

When the meter 14 is mated with the connector 12 in the connecting position, alternating ones of the electrical wires/terminals/blade contacts would be inputs from a power source or load, while the other alternating electrical wires/terminals/blade contacts would be outputs of the system, resulting in four pairs of inputs and outputs. Each current circuit is then closed by a current measuring device (not shown) located inside the meter housing. When the meter 14 is to be unmated from the connector 12, short circuits must first be provided between the inputs and the outputs of each pair in order to prevent each current circuit from being opened. Therefore, a switch mechanism in the form of a rotatable switch shaft, generally designated 40 (FIG. 6), is rotatably mounted within the housing 30 of the connector 12.

In an alternative embodiment, the switch mechanism takes the form of a sliding actuator generally designated 62 (FIGS. 10, 13, 15, and 16) that is moved within the housing 30 of the connector 12. In either embodiment the switch mechanism can include portions of the housing (30).

More particularly, referring to FIG. 7 in conjunction with FIG. 6, the switch shaft 40 is elongated and is rotatable about its longitudinal axis indicated at 42. Four switch terminals, generally designated 44, are mounted on the switch shaft at spaced intervals longitudinally therealong. As seen by the removed switch terminal 44 in FIG. 7, each switch terminal includes a blade-like body portion 44a that is press-fit into a respective slot 46 in the switch shaft 40 in the direction of arrow "C." Each switch terminal includes a pair of contact portions 44b for engaging a pair of the input and output terminals 32 related to the same circuit. In other words, with each adjacent input and output electrical wire 36 and their respective input and output terminals 32, one switch terminal 44 is provided with two contact portions 44b for shorting out that respective pair of input and output wires/terminals, as will be seen hereinafter.

Still referring to FIGS. 6 and 7, the switch shaft 40 may be fabricated of a non-conductive material such as plastic or the like, and each opposite end of the shaft is provided with a locking member or latch slot 48 that is somewhat elongated for receiving one of the latch projections 26 (FIG. 1) inside one of the pivot arms 22a of the actuating lever 22. When the elongated latch projections 26 on the lever 22 are inserted into the elongated latch slots 48 of the switch shaft 40, a driving connection is created between the lever and the switch shaft for rotating the shaft in response to pivoting the lever. As best seen in FIG. 7, a pair of locking bosses 50a and 50b project radially from the switch shaft at each opposite end thereof. Referring back to FIG. 2, it can be seen that the housing of the connector 12 is provided with a locking recess 52 for receiving either one of the locking bosses 50a or 50b.

Figure 10:
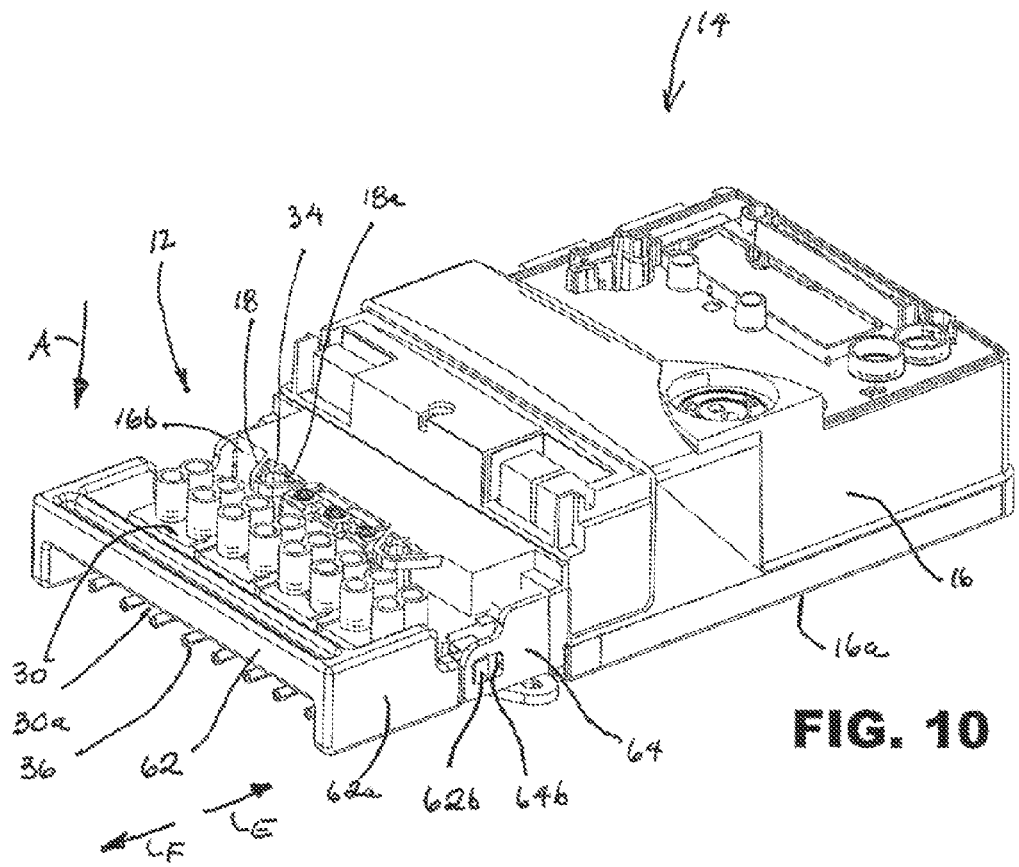
FIG. 10 is a perspective view of an alternate embodiment with a sliding switch actuator in its disconnecting position from the electrical device.
Figure 13:
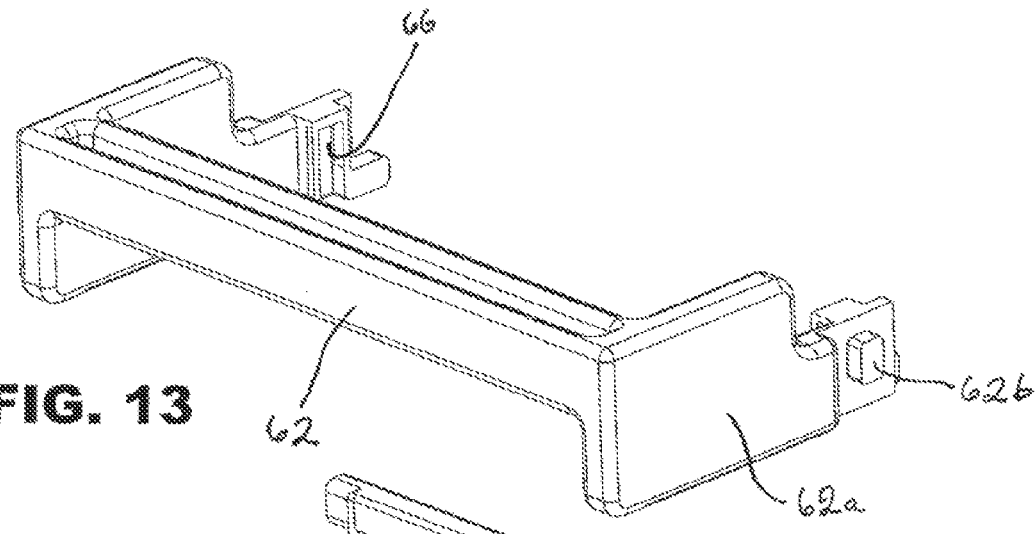
FIG. 13 shows a perspective view of the sliding actuator of the alternate embodiment.

In an alternate embodiment, the switch shaft 40 is replaced with a sliding shaft 70 that slides in either direction "E" or "F" in FIG. 10. The switch terminals 74 are mounted at spaced intervals longitudinally along the actuator 60. The electrical device 14 includes a non-conductive housing 16 having a generally planar rear mounting face 16a and a bottom face 16b. A pair of guide bosses 18 project from the bottom face. The guide bosses have through-holes 18a that extend in the mating direction "A". An actuator in the form of an actuating lever, generally designated 62, is slidably mounted at the bottom of the housing 16. The lever has a pair of sliding arms 62a that are mounted by means of a pair of sliding bosses 62b inside an opening 64b in a pair of flanges 64 that project forwardly of housing 16 at opposite ends. As shown in FIG. 13, the elongated latch slot 66 is directed inwardly at the distal end of each sliding arm 62a.

FIG. 10 shows the electrical device 14 moved into full mating condition with the connector 12. Once the device is mated with the connector, the actuating lever 62 on the meter can be slid in the direction of arrow "E" until the lever reaches a connecting position.

Figure 11:
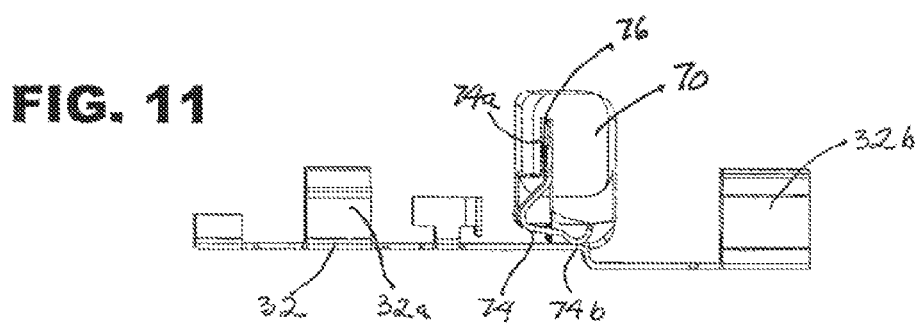
FIG. 11 shows an end elevation view of the switch shaft of the alternative embodiment in conjunction with one of the connector terminals, and with the shaft in its disconnecting position from the electrical device.
Figure 12:
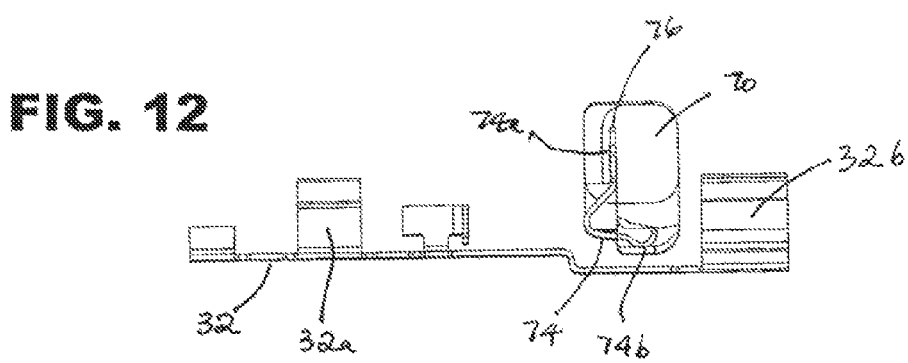
FIG. 12 shows an end elevation view of the switch shaft in the alternative embodiment in conjunction with one of the connector terminals, and with the shaft in its connecting position from the electrical device.

Referring to FIG. 10 in conjunction with FIGS. 11 and 12, the connector 12 includes a non-conductive housing 30 that mounts a plurality of input and output terminals, generally designated 32. The housing has a pair of guide projections 34 that is received within the guide holes 18a of the guide bosses 18 at the bottom of the housing 16 of the meter 14, as can be seen clearly in FIG. 10. The terminals 32 are elongated and include the terminating portions 32a at one end for termination to a plurality of electrical wires 36. The terminals have contact portions 32b at the opposite ends thereof for receiving blade contacts from the device 14. The contact portions 32b are spring-loaded and bifurcated for receiving the blade contacts and clamping the blade contacts under good contacting forces.

Figure 14:
FIG. 14 shows a perspective view of the sliding switch shaft of the alternate embodiment.

Referring to FIG. 14 in conjunction with FIGS. 11, 12, and 14, the switch shaft 70 is elongated and is slidable within the housing 16. Four switch terminals, generally designated 74

(FIGS. 11 and 12), are mounted on the switch shaft at spaced intervals longitudinally therealong. Each switch terminal includes a blade-like body portion 74a that is press-fit into a respective slot 76 in the switch shaft 70. Each switch terminal includes a pair of contact portions 74b for engaging a pair of the respective input and output terminals 32. In other words, with each adjacent input and output electrical wire 36 and their respective input and output terminals 32, one switch terminal 74 is provided with the two contact portions 74b for shorting out that respective pair of input and output terminals.

Figure 15:
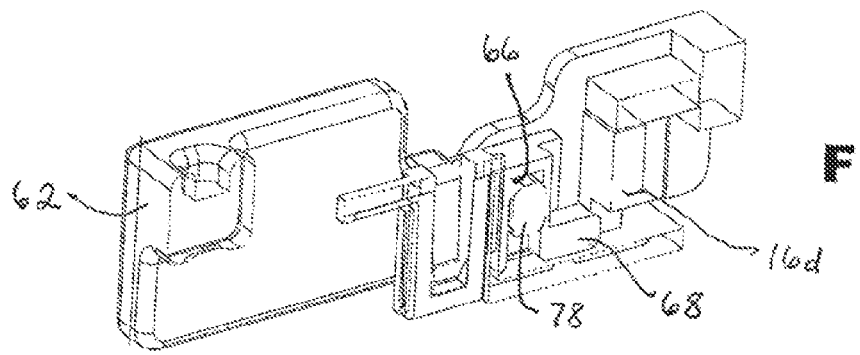
FIG. 15 is a perspective cross sectional view of the alternate embodiment similar to FIG. 10 with a sliding switch actuator in its disconnecting position from the electrical device.
Figure 16:
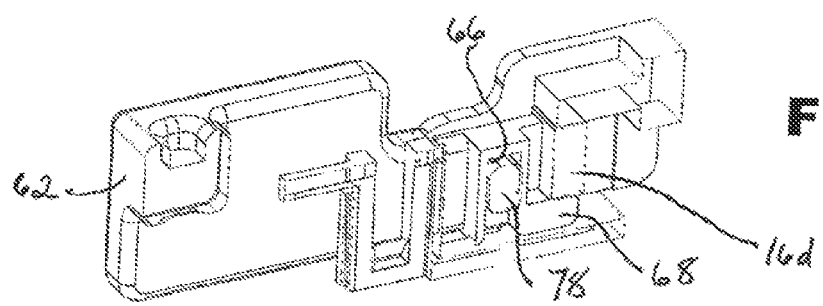
FIG. 16 is a perspective cross sectional view of the alternative embodiment view with the sliding switch actuator in its connecting position when the connector is connected to the electrical device.

Referring to FIGS. 13, 14, 15, and 16, the switch shaft 70 may be fabricated of a non-conductive material such as plastic or the like, and each opposite end of the shaft is provided with a latch projection 78 that is somewhat elongated for being received in one of the latch slots 66 inside one of the sliding arms 62a of actuating lever 62. When the elongated latch slots 66 on the lever 22 are inserted into the elongated latch projections 78 of the switch shaft 70, a driving connection is created between the lever and the switch shaft for sliding the shaft in response to sliding of the lever. As seen in FIGS. 15 and 16, a pair of locks or locking bosses 68 project outwardly from the actuator lever 62 at each opposite end thereof. FIG. 15 shows the electrical device 14 and the connector 12 when they are first moved together but prior to their being locked together. This corresponds to FIG. 11 where the switch terminals 74 are in the shorting position with the input output terminals 32. In FIG. 16 the actuator lever 62 has been moved in the direction "E" that is where the electrical device 14 and the connector 12 are locked together. In this position, the locking boss 68 slides under the locking member or the locking shoulder 16d. This corresponds to FIG. 12 where the switch terminals 74 are slid out of their shorting position with the input output terminals 32.

Figure 8:
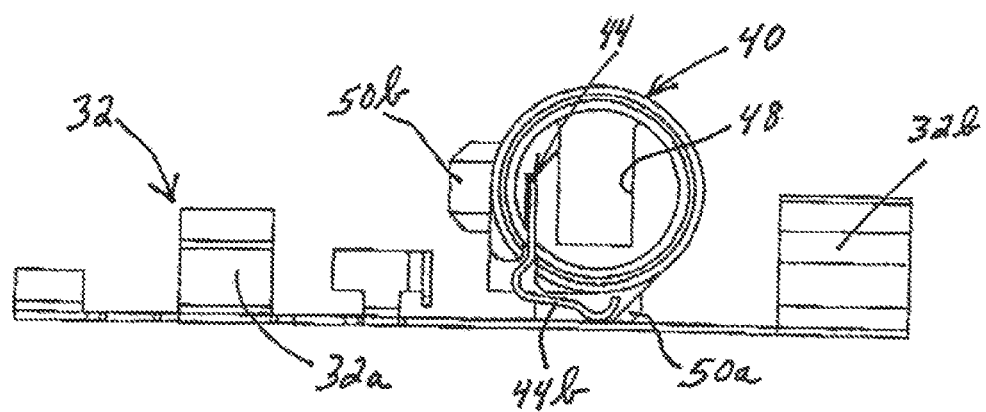
FIG. 8 shows an end elevation view of the switch shaft in conjunction with one of the connector terminals, and with the shaft in its disconnecting position from the electrical device.
Figure 9:
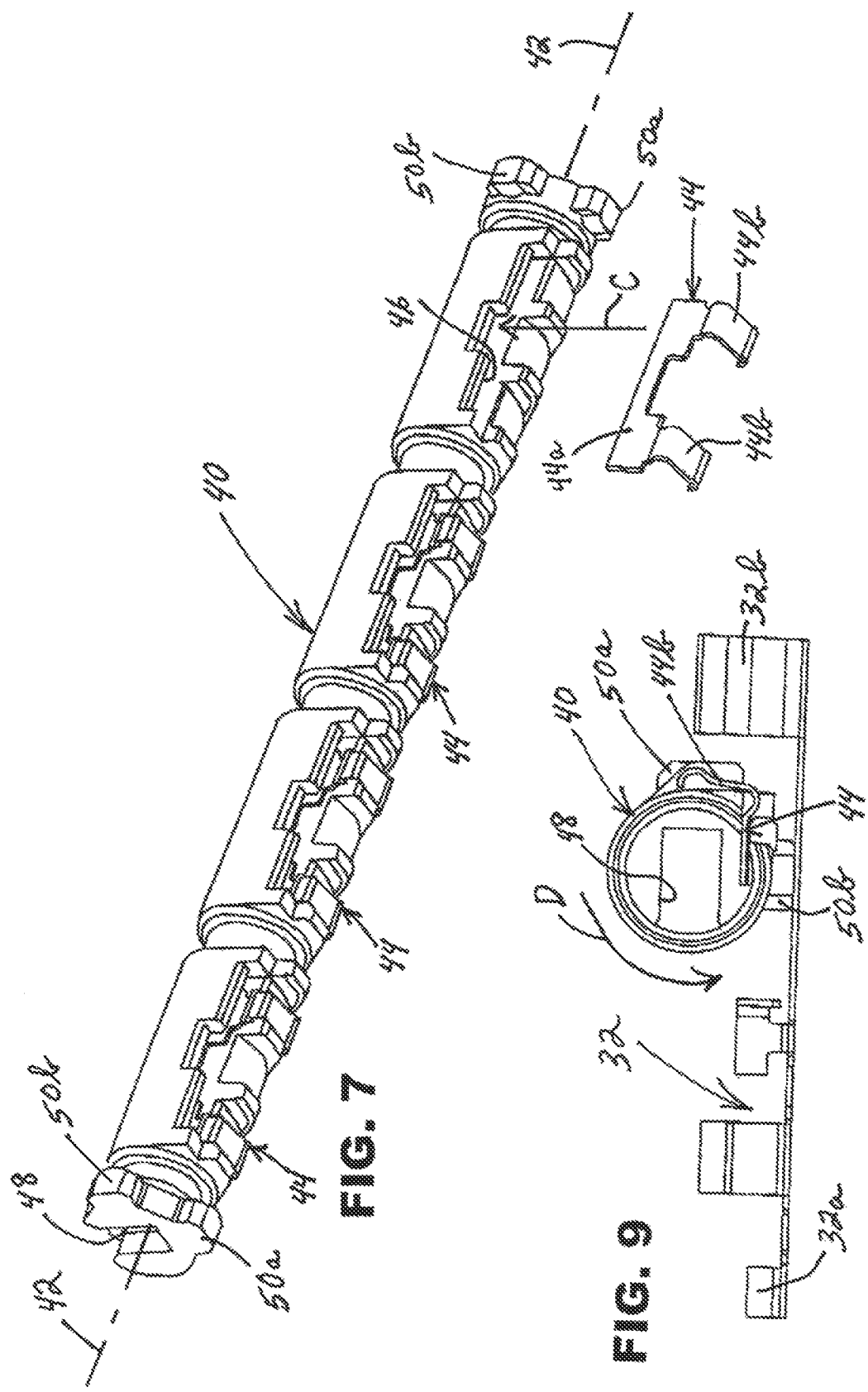
FIG. 9 is a view similar to that of FIG. 8, with the switch shaft in its connecting position when the connector is connected to the electrical device.

The operation of the electrical connector assembly 10 now will be described, particularly in relation to the function of the switch shaft 40 as seen in FIGS. 8 and 9 and the sliding actuator 62 in FIGS. 10-16. In particular, after proper calibration, the meter 14 is mated with the connector 12 as described above in relation to the sequential depictions in FIGS. 2 and 3. It should be noted that the connector, in the disconnected position as seen in FIGS. 1 and 2, have fewer areas of exposed terminals that can be contacted by other conductive parts or by an operator's hands. This makes the connector safer than the prior art connectors.

For mating to occur, the actuating lever 22, 62 must be in the position shown on FIGS. 2 and 10 respectively with respect to the meter housing 16. At the electrical connectors side, the switch shaft 40 is in a shorting position wherein the contact portions 40b of the switch terminals 44 are establishing short circuits between the input and output terminals 32 and their respective input and output electrical wires 36, and wherein the latch slots 48 at opposite ends of the shaft open upwardly or the latch projections 78 open downwardly (see FIGS. 15, 16). It can be seen that locking bosses 50a at opposite ends of the shaft are locked within the locking recesses 52 to hold the shaft in this position.

The meter 14 is moved into mating position with the connector in the direction of arrow "A" whereby the blade contacts 20 of the meter 14 are pushed into the bifurcated contact portions 32b of terminals 32 as seen in FIG. 6. As seen in FIG. 3, the latch projections 26 (FIG. 1) on the lever 22 will move into the latch slots 48 or, as seen in FIGS. 15 and 16, the latch projection 78 will move into the latch slots 66 in the sliding lever 62 to establish a driving connection between the actuation lever 22, 62 and the shaft 40, 70. Also the guide projections 34 are received within the guide holes 18a, which helps to prevent movement between the electrical device 14 and the connector 12 in either direction "E" or "F". In this pre-existing position, the switch shaft 40, 70, as seen in FIGS. 8 and 11, the contact portions 40b, 70b of the switch terminals 44, 74 are still establishing short circuits between the input and output terminals 32 and their respective input and output electrical wires 36. However, additional current circuits provided by the meter in parallel to short circuits will now exist, making it possible to remove the short circuits with out any risk of an open circuit.

The actuating lever 22 then is pivoted in the direction of arrow "B" (FIG. 3) to the position shown in FIGS. 4 and 5 or the actuator lever 62 is slid in the direction of arrow "E".

Pivoting of the lever 22 correspondingly rotates the switch shaft 40 in the direction of arrow "D" as seen in FIG. 9. Moving the sliding actuator 62 in the direction of arrow "E" slidably moves the switch shaft 70, as seen in FIG. 12. This moves the contact portions 44b, 74b of the switch terminals 44, 74 out of shorting engagement with the input and output terminals 32. The movement of the switch terminals 44, 74 over the input and output terminals 32 will remove some of any non-conductive material that may build up on either of the contact surfaces between the switch terminals 44, 74 and the input and output terminals ensuring a better electrical connection.

With the blade contacts 20 of the meter 14 inserted into the contact portions 32b of the terminals 32, circuits now are closed with electrical current flowing into and out of the meter 14. In the shorting condition of the switch shaft 40, the locking bosses 50a are snapped into the locking recesses 52 as seen in FIG. 2 to hold the switch shaft in its shorting position. When the lever rotates the shaft to the position of FIG. 9, the locking bosses 50a snap out of the locking recesses 52 and the locking bosses 50b snap into the locking recesses to hold the shaft and the lever in the connecting position of the meter and the connector.

Other features that should be noted include the fact that the meter 14 cannot be disconnected from the connector 12 when the rotating lever 22 is in the position of FIGS. 4 and 5 or when the sliding actuator 62 is in the position as seen in FIG. 16. In other words, the interengagement of the latch projections 26 on the lever within latch the slots 48 on the shaft or of the locking boss 68 of the sliding actuator 62 under the locking shoulder 16d will provide latch means to help hold the meter and the connector in a mated condition. FIG. 8 represents a disconnecting position of the switch shaft 40 whereby the latch projections 26 can be easily moved out of the latch slots 48 and further whereby the switch terminals 44 engage the input-output terminals 32. FIGS. 10 and 15 also represent a similar disconnecting position. FIGS. 9 and 12 represent a connecting position of switch shaft 40, 70 with the meter and connector connected to each other. This locking occurs because the latch projections 26 can not be removed from the latch slots 48 or the locking boss 68 cannot be removed from under locking shoulder 16d along with the interaction between the guide projections 34 and the guide holes 18a. In this connecting position the switch terminals 44, 74 are out of engagement with the input and output terminals 32.

As seen in FIGS. 4 and 10, the housing 30 of the connector 12 has a rear mounting face 30a that is coplanar with the rear mounting face 16a of the housing 16 of the meter 14, whereby the connector assembly 10 can be mounted on a flat or generally planar support surface. To that end, as seen in FIG. 5, the housing of the connector has a mounting flange 30b projecting out of each opposite side thereof for receiving appropriate fasteners to mount the connector to the support surface. The meter 14 has a mounting flange 16c for receiving appropriate fasteners to mount the meter to the support structure.

While a preferred embodiment of the Present Disclosure is shown and described, it is envisioned that those skilled in the art may devise various modifications without departing from the spirit and scope of the foregoing Description and the appended Claims.

What is claimed is:

1. A mating connector system, comprising:
a mating electrical device including a latch and at least a pair of conductive contacts; and
an electrical connector assembly including an insulating housing, at least a pair of conductive input and output terminals mounted on the housing, the terminals including contact portions for engaging contacts of the mating electrical device, and a switch mechanism movably mounted on the housing for movement between a connecting position and a disconnecting position, whereby in the connecting position a closed circuit flow is maintained through the electrical device, and in the disconnecting position a closed circuit flow is maintained through the input and output terminals with a shorting circuit;
wherein the switch mechanism includes a shaft and a locking member, the shaft including at least one switch terminal, wherein in the connecting position the locking member is interengaged with a lock on the mating electrical device where the switch terminal is out of engagement with the input and output terminals, and in the disconnecting position the locking member is disengageable from the lock on the mating electrical device so that the device can be removed from the assembly where the switch terminal is in engagement with the input and output terminals forming the short circuit to maintain a closed circuit flow through the connector when the mating electrical device is removed, the switch mechanism designed so that the switch terminals engage the appropriate input and output terminals before the locking member is disengaged from the lock.

2. The electrical connector assembly of claim 1, wherein said switch mechanism comprises a shaft rotatably mounted on the housing, with said switch terminal being disposed at an outer circumferential periphery of the shaft.

3. The electrical connector assembly of claim 2, wherein said shaft is elongated and is rotatable about its longitudinal axis, the input and output terminals are spaced longitudinally of the shaft, the switch terminal extends longitudinally of the shaft, and the switch terminal extends longitudinally for shorting the input and output terminals in the rotatable disconnecting position of the shaft.

4. The electrical connector assembly of claim 1, wherein said mating electrical device includes an actuator for moving the switch mechanism between said positions.

5. The electrical connector assembly of claim 4, wherein said actuator includes said latch for interengagement with the latch member on the movable switch mechanism.

6. The electrical connector assembly of claim 5, wherein said actuator comprises a lever pivotally mounted on the mating electrical device.

7. The electrical connector assembly of claim 1, wherein said connector housing and said mating electrical device have mounting faces mountable on a support structure in a coplanar relationship, the mating electrical device being mateable onto the housing in a mating direction generally perpendicular to their mounting faces.

8. The electrical connector assembly of claim 7, including a plurality of guide projections on the connector housing extending in said mating direction for receipt in a corresponding plurality of guide apertures in the mating electrical device.

9. The electrical connector assembly of claim 1, including locking means for holding the switch mechanism in either of its connecting or disconnecting positions.

10. The electrical connector assembly of claim 5, wherein said actuator is slidably mounted on the mating electrical device.

11. An electrical connector assembly according to claim 1, wherein said electrical device is a watt-hour meter.

12. A method of connecting an electrical device to a connector assembly incorporating a connector with a switch while maintaining a closed circuit flow through the connector, comprising the steps of:
moving an electrical device into electrical engagement with the connector assembly so that at least a pair of input and output terminals from one circuit mounted on the housing of the connector assembly engages contacts of the mating electrical device and so that a lock on the mating electrical device is inserted into locking member on a switch mechanism movably mounted on the housing for movement between a connecting position and a disconnecting position, whereby in the connecting position, a closed circuit flow is maintained through the electrical device, and in the disconnecting position a closed circuit flow is maintained through the input and output terminals with a shorting circuit, held in the connector, the switch mechanism including at least one switch terminal that is in engagement with the pair of input and output terminals forming the short circuit to maintain a closed circuit thought the connector; and
moving the switch mechanism to the connecting position that first engages the lock to the locking member and then disengages the switch terminal from the pair of input and output terminals removing the short circuit and allowing current to flow through the meter.

13. The method of claim 12, wherein the step of moving the switch mechanism includes sliding movement of the switch mechanism in relation to the connector housing.

14. The method of claim 12, wherein the step of moving the switch mechanism includes rotating movement of the switch mechanism in relation to the connector housing.

* * * * *